(12) United States Patent
Agarwal et al.

(10) Patent No.: US 10,763,889 B1
(45) Date of Patent: Sep. 1, 2020

(54) ANALOG-TO-DIGITAL CONVERTER WITH DYNAMIC RANGE ENHANCER

(71) Applicant: TEXAS INSTRUMENTS INCORPORATED, Dallas, TX (US)

(72) Inventors: Uttam Kumar Agarwal, Bengaluru (IN); Anand Kannan, Bengaluru (IN); Ramamurthy Vishweshwara, Bengaluru (IN); Anand Subramanian, Bengaluru (IN); Pedro Ramon Gelabert, Allen, TX (US); Diljith Mathal Thodi, Bengaluru (IN); Abhijit Anant Patki, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/661,456

(22) Filed: Oct. 23, 2019

Related U.S. Application Data (60) Provisional application No. 62/822,072, filed on Mar. 22, 2019.

(51) Int. Cl.
| | |
|---|---|
| *H03M 3/00* | (2006.01) |
| *H03G 3/00* | (2006.01) |
| *H03G 1/00* | (2006.01) |
| *H03G 3/30* | (2006.01) |
| *H03M 7/34* | (2006.01) |
| *H03M 1/12* | (2006.01) |

(Continued)

(52) U.S. Cl.
CPC ............ *H03M 3/47* (2013.01); *H03G 1/0088* (2013.01); *H03G 3/001* (2013.01); *H03G 3/3026* (2013.01); *H03M 1/06* (2013.01); *H03M 1/12* (2013.01); *H03M 3/30* (2013.01); *H03M 7/3051* (2013.01); *H03G 5/025* (2013.01)

(58) Field of Classification Search
CPC ............ H03M 3/30; H03M 1/12; H03M 1/06; H03M 7/3051; H03G 5/025
USPC ............ 341/143, 155, 118, 77; 381/104, 106
See application file for complete search history.

(56) References Cited

U.S. PATENT DOCUMENTS

| | | | |
|---|---|---|---|
| 2007/0120721 A1 | 5/2007 | Caduff et al. | |
| 2008/0218602 A1* | 9/2008 | Kozlowski | H04N 5/235 348/231.99 |
| 2010/0164763 A1 | 7/2010 | Kidambi | |

(Continued)

OTHER PUBLICATIONS

International Search Report in corresponding PCT Patent Application No. PCT/US2020/024156, dated Jun. 4, 2020 (2 pages).

*Primary Examiner* — Joseph J Lauture
(74) *Attorney, Agent, or Firm* — John R. Pessetto; Charles A. Brill; Frank D. Cimino (57) ABSTRACT

A circuit includes a programmable gain amplifier (PGA) having a PGA output. The circuit further includes a delta-sigma modulator having an input coupled to the PGA output. The circuit also includes a digital filter and a dynamic range enhancer (DRE) circuit. The digital filter is coupled to the delta-sigma modulator output. The DRE circuit is coupled to the delta-sigma modulator output and to the PGA. The DRE circuit is configured to monitor a signal level of the delta-sigma modulator output. Responsive to the signal level being less than a DRE threshold, the DRE circuit is configured to program the PGA for a gain level greater than unity gain and to cause the digital filter to implement an attenuation of a same magnitude as the gain level to be programmed into the PGA.

20 Claims, 5 Drawing Sheets

(51) Int. Cl.
*H03M 1/06* (2006.01)
*H03G 5/02* (2006.01)

(56) References Cited

U.S. PATENT DOCUMENTS

2014/0361912 A1  12/2014  da Silva et al.
2016/0314805 A1  10/2016  Mortazavi et al.

* cited by examiner

ANALOG-TO-DIGITAL CONVERTER WITH DYNAMIC RANGE ENHANCER

CROSS-REFERENCE TO RELATED APPLICATIONS

This application claims priority to U.S. Provisional Application No. 62/822,072, filed Mar. 22, 2019, which is hereby incorporated by reference.

BACKGROUND

Some applications process audio signals. For example, voice-enabled applications include a signal chain that receives and processes an audio analog input signal (e.g., a voice signal). The signal chain may include an amplifier, an analog-to-digital converter (ADC), filters, etc. The growth of voice-enabled applications with far-field pickup benefits from a large dynamic range. The signal-to-noise ratio (SNR) of the signal path unfortunately limits the dynamic range.

SUMMARY

In one example, a circuit includes a programmable gain amplifier (PGA) having a PGA output. The circuit further includes a delta-sigma modulator having an input coupled to the PGA output. The circuit also includes a digital filter and a dynamic range enhancer (DRE) circuit. The digital filter is coupled to the delta-sigma modulator output. The DRE circuit is coupled to the delta-sigma modulator output and to the PGA. The DRE circuit is configured to monitor a signal level of the delta-sigma modulator output. Responsive to the signal level being less than a DRE threshold, the DRE circuit is configured to program the PGA for a gain level greater than unity gain and to cause the digital filter to implement an attenuation of a same magnitude as the gain level to be programmed into the PGA.

BRIEF DESCRIPTION OF THE DRAWINGS

For a detailed description of various examples, reference will now be made to the accompanying drawings in which.

DETAILED DESCRIPTION

Figure 1:
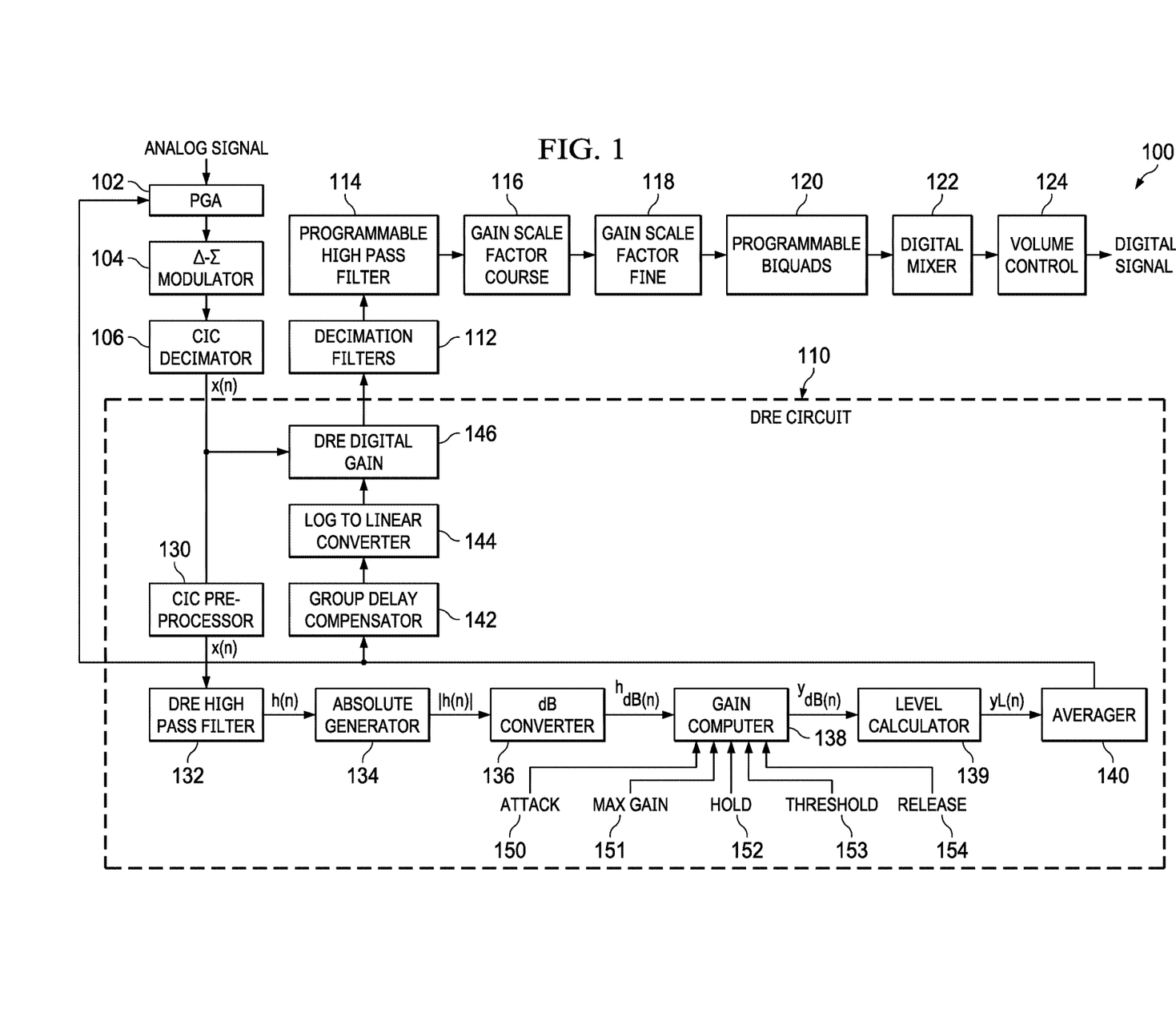
FIG. 1 shows an example schematic for an ADC with dynamic range enhancement.

FIG. 1 shows an example schematic of an ADC 100 usable, for example, to process electrical signals from audio sources (e.g., microphones). In this example, the ADC 100 includes a programmable gain amplifier (PGA) 102, a delta-sigma modulator 104, a cascaded integrated comb filter (CIC) decimator 106, decimation filters 112, a programmable high-pass filter 114, a gain scale factor course adjustment 116, a gain scale factor fine adjustment 118, programmable biquads 120, a digital mixer 122, volume control 124, and a dynamic range enhancement (DRE) circuit 110. The decimation filters 112, a programmable high-pass filter 114, a gain scale factor course adjustment 116, a gain scale factor fine adjustment 118, programmable biquads 120, a digital mixer 122, volume control 124 comprise a digital signal chain. The PGA 102 includes an input that receives an analog signal (e.g., an audio signal) to be converted to a digital signal by the ADC 100. The gain of the PGA 102 is programmable. In one implementation, for example, the gain of the PGA 102 can be programmed in a range of unity gain (zero DB) to an upper gain setting of 60 dB in increments of 0.5 dB (i.e., 0 dB, 0.5 dB, 1 dB, 1.5 dB, etc.).

The analog-to-digital conversion process in this example uses a delta-sigma modulator 104. The output of the delta-sigma modulator 104 is provided to an input of CIC decimator 106. The CIC decimator 106 lowers the data output rate of the delta-sigma modulator 104 thereby decreasing the power consumption of the subsequent digital logic. The output signal from the CIC decimator 106 is designated x(n). The signal x(n) is modified by the DRE circuit 110 and provided to the decimation filters 112, which continue to lower the oversampled data rate to the desired Nyquist sample rate of the output signal. The programmable high-pass filter 114 comprises a digital filter that removes the signal's DC component. The filtered signal from the programmable high-pass filter 114 is modified according to gain settings implemented by the gain scale factor coarse adjustment 116 and gain scale factor fine adjustment 118. The overall gain scale factor compensates for any gain offset between analog input channels and/or microphones. The programmable biquads 120 offer custom frequency shaping to the user. Digital mixer 122 provides the ability to combine multiple channels into a single output or improve the signal-to-noise ratio (SNR) of the input signal by feeding the same input to multiple channels and equally summing them together. Finally, volume control 124 provides fine control of the output signal level The PGA 102, delta-sigma modulator 104, CIC decimator 106, decimation filters 112, filter 114, gain scale factor adjustments 116 and 118, programmable biquads 120, digital mixer 122, and volume control 124 comprise a signal path of the analog signal through the ADC 100 to convert the analog signal into a digital signal.

The DRE circuit 110 includes a CIC pre-processor 130, a DRE high-pass filter 132, an absolute generator 134, a dB converter 136, a gain computer 138, a level calculator 139, an averager 140, a group delay compensator 142, and a log-to-linear converter 144. The DRE circuit 110 improves the dynamic range of the delta-sigma modulator by increasing the gain of the PGA 102 for signal levels (x(n)) below a threshold level, and then digitally attenuating the filtered signals by the same magnitude as the gain of the PGA 102. For example, if the PGA 102 were to be programmed by the DRE circuit 110 for +24 dB of gain, then −24 dB of attenuation would be applied to the digitally-filtered signals. As a result, the signal chain will implement a unity gain as between its input and output. In some implementations, the gain of the signal chain can be other (e.g., greater) than unity gain, and the increase in gain and subsequent attenuation described herein will maintain the overall gain of the channel unchanged whether the overall gain is unity gain or a different gain factor. By increasing the gain of the PGA 102 for low level input signals, the signal levels are boosted above the input referred noise level of the delta-sigma modulator 104. As such, the delta-sigma modulator 104 will convert otherwise low-level input signals to digital codes with lower noise, which allows the use of a lower performance (e.g., higher noise), lower cost delta-sigma modulator 104 while maintaining the high dynamic range of a more expensive delta-sigma modulator.

The CIC pre-processor 130 of the DRE circuit 110 receives x(n) as an input signal. In one example implementation, the CIC pre-processor 130 averages several CIC output samples and removes the previously applied PGA gain. The CIC pre-processor 130 implements the following logic in at least one example:

$$g(n) = invPGAgain/N * \left\{ \sum_{k=0}^{N} x(n-k) \right\} \tag{1}$$

where invPGAgain is the inverse PGA gain, and N is the number of CIC outputs to average together. This lowers the power consumption of the DRE and smooths out any fast changing signals from the estimate of the input level.

The processed signal from the CIC pre-processor 130 is provided to the DRE high-pass filter 132 which removes DC offset for accurate calculation of input signal level.

In one example, the DRE high pass filter 132 is given by:

$$h(n) = b_1 g(n) + b_2 g(n-1) - a_2 h(n-1) \tag{2}$$

where h(n) is the current output value from the filter 132, $b_1$, $b_2$, and $a_2$ are filter coefficients, g(n) is the current input value to the filter, g(n−1) is the previous input value to the filter 132, and h(n−1) is the previous output value from the filter 132. In one example, the DRE high pass filter 132 has a 3-dB corner of 4 Hz.

The filtered output, h(n), from the DRE high pass filter 132 is provided to the absolute generator 134 which outputs the absolute value of the filter's output. The dB converter 136 converts the output from the absolute generator 134 from a linear value to a dB value, $h_{db}(n)$. The output $h_{db}(n)$ of the dB converter 136 is:

$$h_{dB}(n) = 20 * \log_{10}(|h(n)|) \tag{3}$$

In one example, the dB converter 136 comprises a look-up table (LUT) which maps input signals, h(n), to output dB values, $h_{db}(n)$ to lower power consumption of the dB conversion. The output of the dB converter 136 is provided to the gain computer 138.

In this example, the gain computer 138 is programmed with parameters that are used to process the input value, $h_{dB}(n)$, to generate an output value, $y_{dB}(n)$. The parameters used by the gain computer 138 include, for example, an attack value 150, a Max Gain value 151, a hold value 152, a threshold value 153, and a release value 154. In one example, the gain computer 138 computes $y_{dB}(n)$ as follows:

$$y_{dB(n)} = \begin{cases} h_{db}(n) & \text{for } h_{db}(n) \geq \text{Threshold} \\ \text{Threshold} & \text{Threshold} - MaxGain < h_{db}(n) < \text{Threshold} \\ h_{db}(n) + MaxGain & h_{db}(n) < \text{Threshold} - MaxGain \end{cases} \tag{4}$$

The gain computer's output value $y_{dB}(n)$ is thus equal to the input value, $h_{dB}(n)$, when the input value is greater than Threshold, meaning that the PGA 102 should be programmed for unity gain (0 dB). If the input value, $h_{dB}(n)$, is less than Threshold, but greater than Threshold minus the programmed Max Gain value 151 (MaxGain), the output signal level from the gain computer 138 should be maintained at the value of Threshold. If the input is below Threshold-MaxGain, the gain computer's output will be computed to be $h_{dB}(n)$+MaxGain.

The calculated output $y_{db}(n)$ from the gain computer 138 is provided to the level calculator 139 which computes:

$$y_L(n) = h_{dB}(n) - y_{dB}(n) \tag{5}$$

The negative value $y_L(n)$ is the value of the gain that should be set for the PGA 102.

The output, $y_L(n)$, from the level calculator 130 is provided to the averager 140, which implements any one of multiple smoothing techniques to avoid glitches (e.g., sudden discontinuities) in the PGA's output signal level. The output of the averager 140 is used to program the gain setting for the PGA 102. In one implementation, the averager 140 implements a Smooth Decoupled averaging technique, which uses the attack value 150 if the input to the averager 140 is greater than a threshold and increasing, or the release value 154 if the input to the averager 140 is relatively low. The attack rate can be different than the release rate. One implementation of the Smooth Decoupled technique is as follows:

$$z_G(n) = \text{Release} * z_G(n-1) + (1 - \text{Release}) * y_L(n) \tag{6}$$

$$z_L(n) = \begin{cases} \text{Attack} * z_L(n-1) + & [z_L(n) \geq z_G(n)] \, \& \\ (1 - \text{Attack}) * z_L(n-1) & (attackCount < attackHold) \, \& \\ & (h_{dB}(n) \geq \text{Threshold} + hysteresis) \\ \text{Attack} * z_L(n-1) + & [z_L(n) \geq z_G(n)] \, \& \\ (1 - \text{Attack}) * y_L(n) & (attackCount < attackHold) \, \& \\ & (h_{dB}(n) \geq \text{Threshold} - hysteresis) \\ \text{Attack} * z_L(n-1) + & \\ (1 - \text{Attack}) * z_L(n-1) & [z_L(n) < z_G(n)] \, \& \\ \text{Attack} * z_L(n-1) + & (releaseCount < releaseHold) \\ (1 - \text{Attack}) * z_G(n) & \text{otherwise} \end{cases} \tag{7}$$

Equations (6) and (7) minimize discontinuities and distortions in the output signal during changes between attacks and releases. Attack and Release can be the same or different values. In practice, the attack rate is smaller (and sometimes significantly smaller) than release rate to prevent the signal from clipping in the delta-sigma modulator when the input signal is rapidly increasing. The releaseHold, attackHold, and hysteresis values prevent artifacts on the output signal when the input signal is constantly switching from a high to a low level, or vice versa. Release count is the consecutive number of times a release occurs after an attack. Similarly, attack count is the consecutive number of times an attack occurs after a release. When an attack follows a release or a release follows an attack, the attack and release counts are cleared. Hysteresis is the amount of signal level change from a previous state around the Threshold where the algorithm does not respond to a change. This allows the input signal to cross back and forth across the threshold level without causing distortion on the output due to constant toggling of DRE gain on and off.

In other implementations, averager 140 implements a weighted exponential moving average (WEMA) or a smooth branching. An example implementation of WEMA includes the averager calculating an output $z_L(n)$ value as:

$$z_L(n) = \text{Release} * z_G(n-1) + (1 - \text{Attack}) * y_L(n) \tag{8}$$

An example implementation of smooth branching includes the average 140 calculating $z_L(n)$ as:

$$z_L(n) = \begin{cases} \text{Release} * z_L(n-1) + & y_L(n) \leq z_L(n-1) - \\ (1-\text{Release}) * y_L(n) & \text{hysteresis \&} \\ & (releaseCount > \text{Hold}) \\ \text{Attack} * z_L(n-1) + & y_L(n) > z_L(n-1) + \\ (1-\text{Attack}) * y_L(n) & \text{hysteresis \&} \\ & (attackCount \geq \text{Hold}) | \\ & (h_{dB}(n) \geq \text{Threshold}) \\ z_L(n-1) & \text{otherwise} \end{cases} \quad (9)$$

where hysteresis and releaseCount are defined similar to the smooth decoupled technique.

As explained above, the DRE circuit 110 is operative to increase the gain of the PGA 102 for signal levels (x(n)) below a threshold, and to cause a corresponding amount of attenuation to be implemented by the digital filters so that the net effect of the increase in gain of the PGA 102 and the attenuation in the digital filters cancels each other out, and the net gain implemented by the signal chain of the ADC 100 is 0 dB. Responsive to signal $y_{dB}(n)$ being above the aforementioned threshold, the PGA 102 is set for unity gain.

Figure 2:
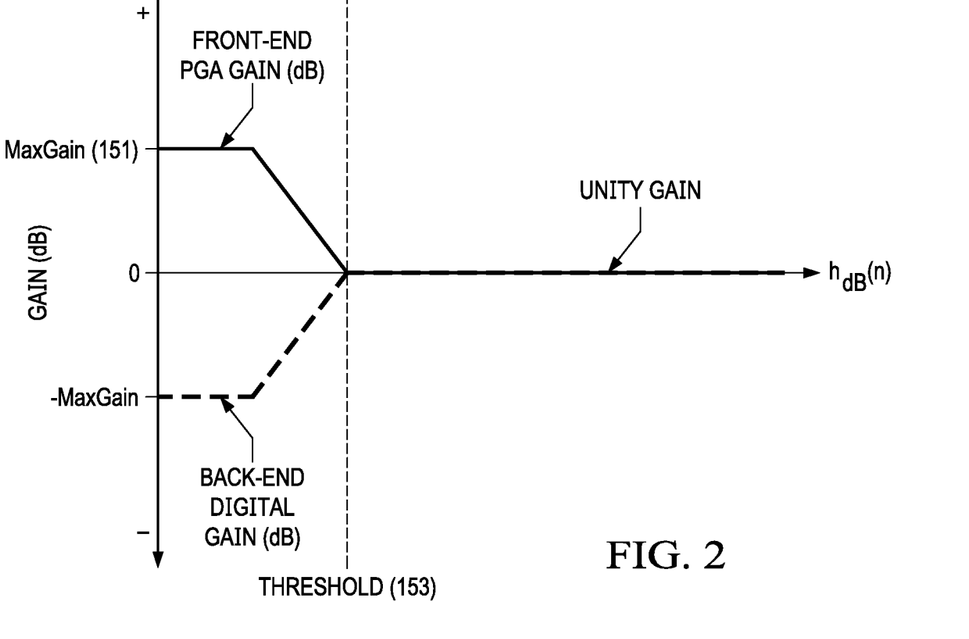
FIGS. 2 and 3 illustrate the relationship between an output signal from a delta-sigma modulator and a programmable gain setting for the ADC.

FIG. 2 shows the relationship between the input to the gain computer 138 (h(dB)) and the gain setting computed to be programmed into the PGA 102, and the corresponding attenuation programmed into the digital filters. At input signal levels above Threshold 153, the gain for the PGA 102 is set to unity gain (0 dB). At input signal levels below Threshold 153, however, the gain to the PGA 102 is increased as the input signal level decreases. The gain is increased as the input signal decreases until the gain setting reaches the programmed Max Gain value 151. As the input signal further decreases, the gain setting of the PGA 102 is maintained at the Max Gain 151. FIG. 2 also shows that a reciprocal attenuation is applied in to the digital back-end. Thus, at signal levels greater than Threshold 153, a unity gain is applied to the digital back-end, but for input signals below Threshold 153 and increasing attenuation is applied to the digital back-end to counterbalance the gain setting programmed into the PGA 102 to thereby maintain a unity gain setting through the complete signal chain.

Figure 3:
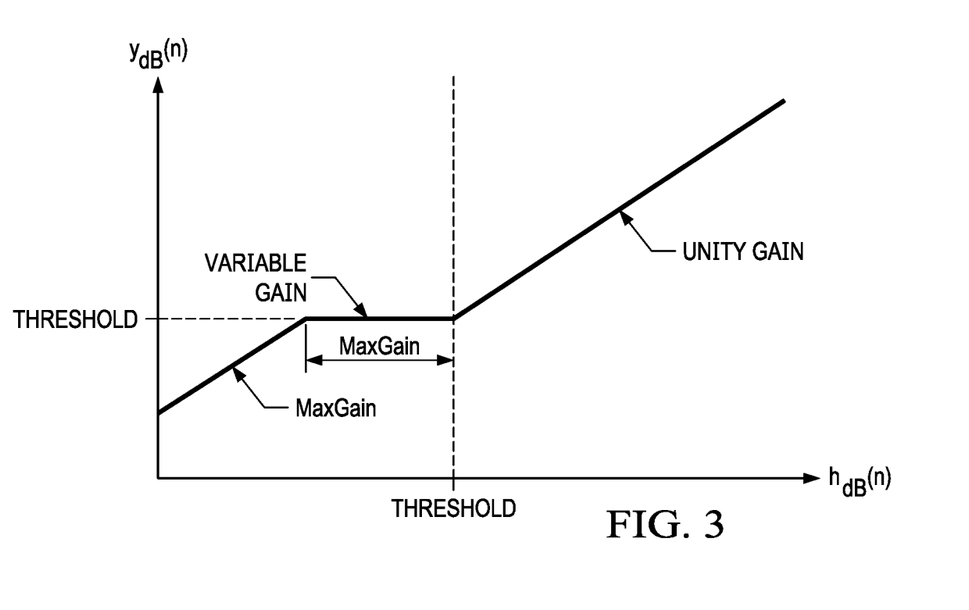

FIG. 3 shows the effect of the gain programmed into the PGA 102 for the range of $h_{dB}(n)$. For $h_{dB}(n)$ above Threshold, unity gain is programmed into the PGA 102 and thus the PGA's output follows its input (i.e., PGA output signal level equals the input signal level). For $h_{dB}(n)$ below Threshold, the PGA's gain is increased above unity gain to maintain the PGA output at a constant level equal to Threshold, until Max Gain is reached.

Referring back to FIG. 1, the gain setting provided by the averager 142 to the PGA 102 is also provided to the group delay compensator 142. The group delay compensator 142 comprises one or more delay elements to delay application of the corresponding attenuation value into the digital back-end to account for the delay through signal chain, including the PGA 102, delta-sigma modulator 104, and CIC decimator 106, as well as the processing elements of the DRE for each channel. The group delay compensator 142, therefore, causes a reciprocal attenuation to be applied into the digital back-end to coincide with the sample that was applied by the output of the PGA 102, delta-sigma modulator 104, and CIC decimator 106. The delayed attenuation value from the group delay compensator 142 is provided to the log-to-linear converter 144, which converts the attenuation dB value to a linear value to be applied to the DRE digital gain element 146. In one example, the log-to-linear converter 144 comprises a look-up table which maps dB attenuation values to corresponding linear values to lower power consumption of the system.

In the example of FIG. 1, the DRE signal level estimation occurs between the delta-sigma modulator 106 and the digital filters. In other implementations, the DRE circuit 110 can be coupled to an output of the digital filters (e.g., output of decimation filters 112).

Figure 4:
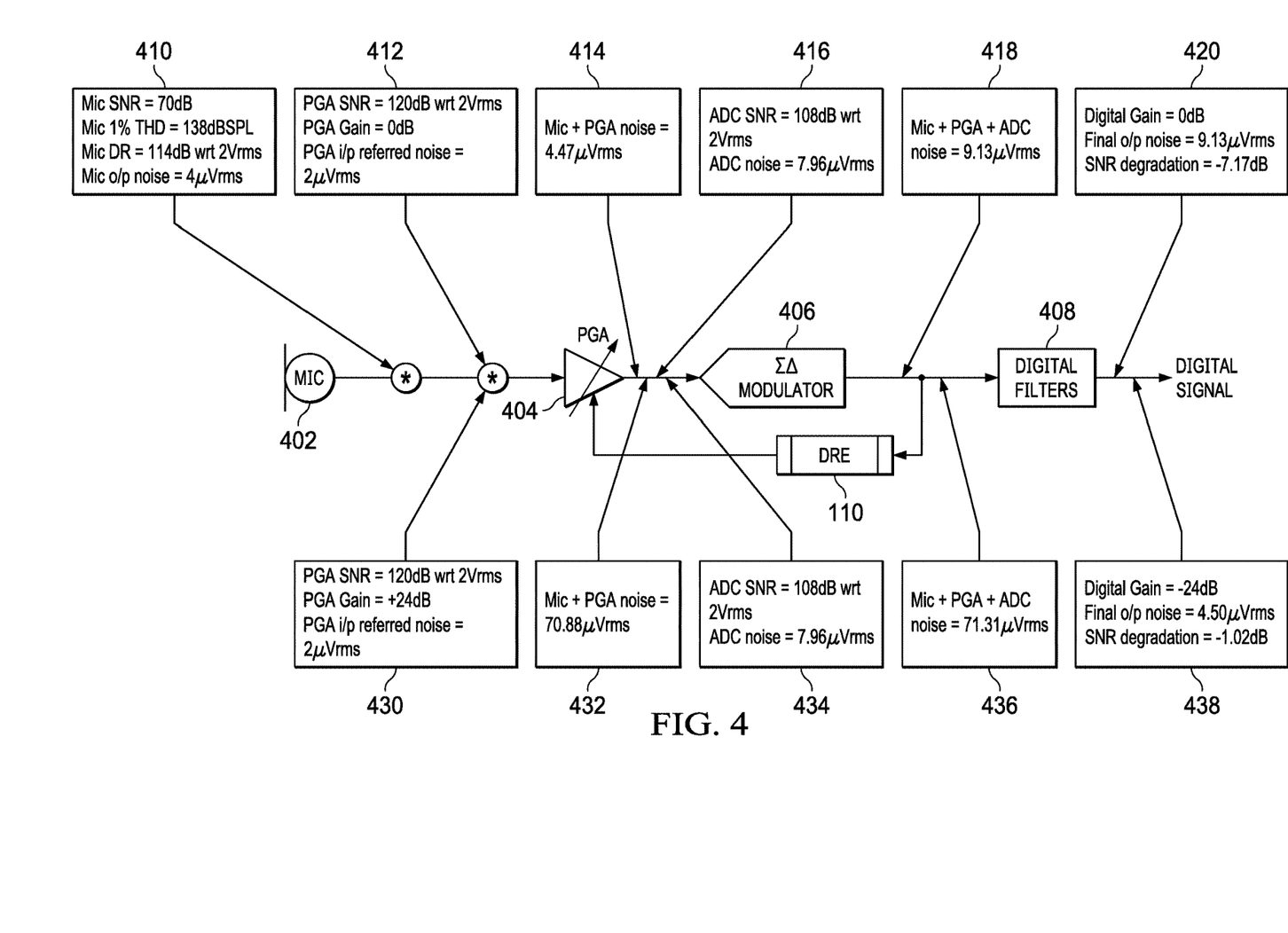
FIG. 4 shows an example of the effects on SNR of the signal path through the ADC with and without the dynamic range enhancement enabled.

FIG. 4 provides an example illustrating the benefit of the DRE circuit 110. FIG. 4 shows a microphone 402, a PGA 404, a delta-sigma modulator 406, and digital filters 408. The sets of values 410, 412, 414, 416, 418, and 420 across the top of the figure represent example values for SNR, noise, and the like at various points along the signal chain. As illustrated by the example of 410, the microphone 402 has an SNR of 70 dB, a dynamic range of 114 dB with respect to a root mean square voltage of 2 Vrms, and an output noise value of 4 microvolts rms (4 μVrms). Values 412 illustrate that the PGA 404 has an SNR of 12 dB with respect to 2 Vrms, is set for a gain of 0 dB, and has an input referred noise value of 2 μVrms. The root mean square noise at the output of the PGA 414 is shown at 404 as 4.47 μVrms, and is the root mean square of the 4 μVrms microphone output noise and the 2 μVrms PGA input referred noise. In this example, the delta-sigma modulator 406 has an SNR value of 108 dB with respect to 2 Vrms and adds noise of 7.96 μVrms (416). The root mean square of the PGA's output 4.47 μVrms and the delta-sigma modulator's 7.96 μVrms is calculated at 418 as 9.13 μVrms. Reference numeral 420 shows that the final output noise is thus 9.13 μVrms. The degradation of the dynamic range due to the signal path of the PGA 404, delta-sigma modulator 406, and digital filters 408 is thus 20× log (9.13 μVrms/ 4 μVrms)=7.17 dB. As such, without the benefit of the DRE circuit 110, the dynamic range of the ADC will be 114 dB-7.17 dB=106.83 DB.

As illustrated across the bottom of FIG. 4, the DRE circuit 110 is shown as adjusting the gain of the PGA 404 based on the output signal from the delta-sigma modulator 406. The bottom set of values 430, 432, 434, 436, and 438 illustrate the effects of the DRE circuit 110. The adjustment to the gain in this example is shown at 430 as a gain setting of +24 dB. At 412, the PGA 404 was set for a gain of 0 dB, but at 430, due to the delta-sigma modulator output being below the threshold, the PGA's gain is set to +24 dB. The digital filter 408 is set for a corresponding attenuation of −24 dB as shown at 438. The PGA's input referred noise is still 2 μVrms (430), but the root mean square noise at the output of the PGA 404 is shown at 432 as 70.88 μVrms, which is the root mean square of the 4 μVrms microphone output noise and the 2 μVrms PGA input referred noise, with an applied gain of 24 dB. The noise of the delta-sigma modulator 406 is the same, 7.96 μVrms, as shown at 434. The combined root mean square noise at the output of the delta-sigma modulator 406 is thus 71.31 μVrms, as shown at 434. Reference numeral 438 shows that the final output noise is 4.50 μVrms after the attenuation of 24 dB is applied by the digital filters 408. The degradation of the dynamic range due to the signal path of the PGA 404, delta-sigma modulator 406, and digital filters 408 is thus 20× log (4.50 μVrms/4 μVrms)=1.02 dB. As such, with the benefit of the DRE circuit 110, the dynamic range of the ADC will be 114 dB-1.02 dB=112.98 DB, which is substantially higher than 106.83 dB that would have resulted without the DRE circuit 110.

In these examples, the modification to the gain of the gain of the PGA 102 is based on the magnitude of the input signal. As described above, the rms magnitude of the input signal is determined and used to set the PGA's gain. In another example, the average of the input signal can be determined and used to set the PGA's gain. In yet another example, the peak of the input signal can be determined and used to set the PGA's gain. The input signal level is determined in the example above based on the output of the delta-sigma modulator 406. In another example, the signal level could be determined using the output signal from the digital filters 408. Further still, a delta-sigma modulator-based ADC is shown in FIGS. 1 and 4. In other implementations, an ADC other than a delta-sigma modulator-based architecture is used. For example, a successive approximation register (SAR)-based ADC can be used.

Figure 5:
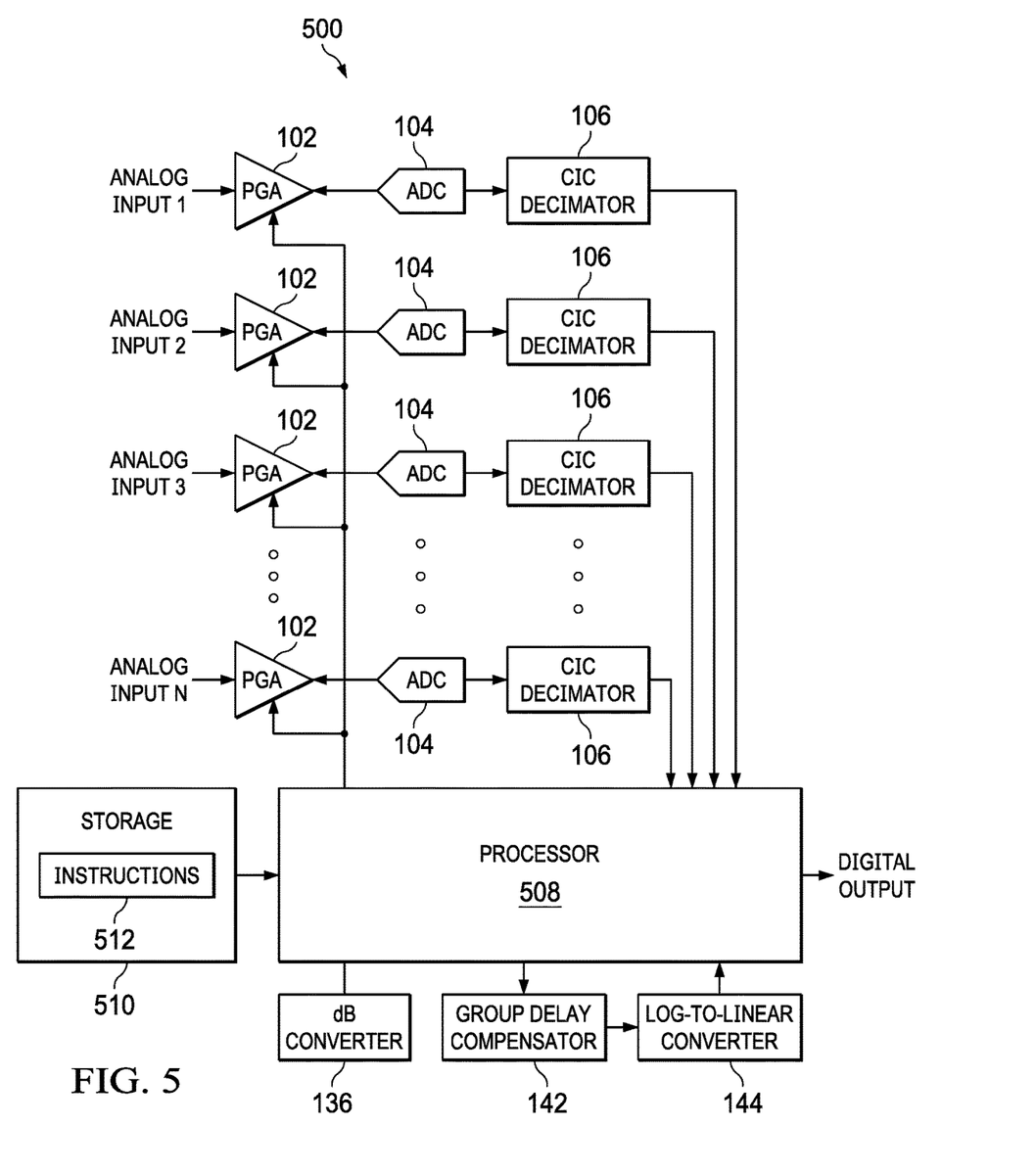
FIG. 5 shows an example of an implementation of the ADC with dynamic range enhancement of FIG. 1.

FIG. 5 shows an illustrative implementation of the ADC 100 of FIG. 1 as ADC 500. ADC 500 in this example provides multiple input channels (Analog Input 1, Analog Input 2, Analog Input 3, . . . , Analog Input N. A PGA 102, a delta-sigma modulator-based ADC 104, and a CIC decimator 106 is provided for each analog input channel. In this example, the PGA 102, delta-sigma modulator-based ADC 104, and CIC decimator 106 of the N input channels couple to and share the other components shown including the dB converter 136, the group delay compensator 142, the log-to-linear converter 144, a processor 508, and storage 510. The storage 510 comprises any suitable type of solid-state storage such as volatile memory (e.g., random access memory) or non-volatile storage (e.g., read-only memory). Storage 510 stores instructions 512 which are executable by the processor 508. In one implementation, the processor is a digital signal processor (DSP). The processor 508, upon execution of instructions 512, performs the functions of the CIC pre-processor 130, DRE high pass filter 132, absolute generator 134, gain computer 138, level calculator 139, averager 140, DRE digital gain 146, decimation filters 112, programmable high-pass filter 114, gain scale factor course 116, a gain scale factor fine 118, programmable biquads 120, digital mixer 122, and volume control 124.

Figure 6:
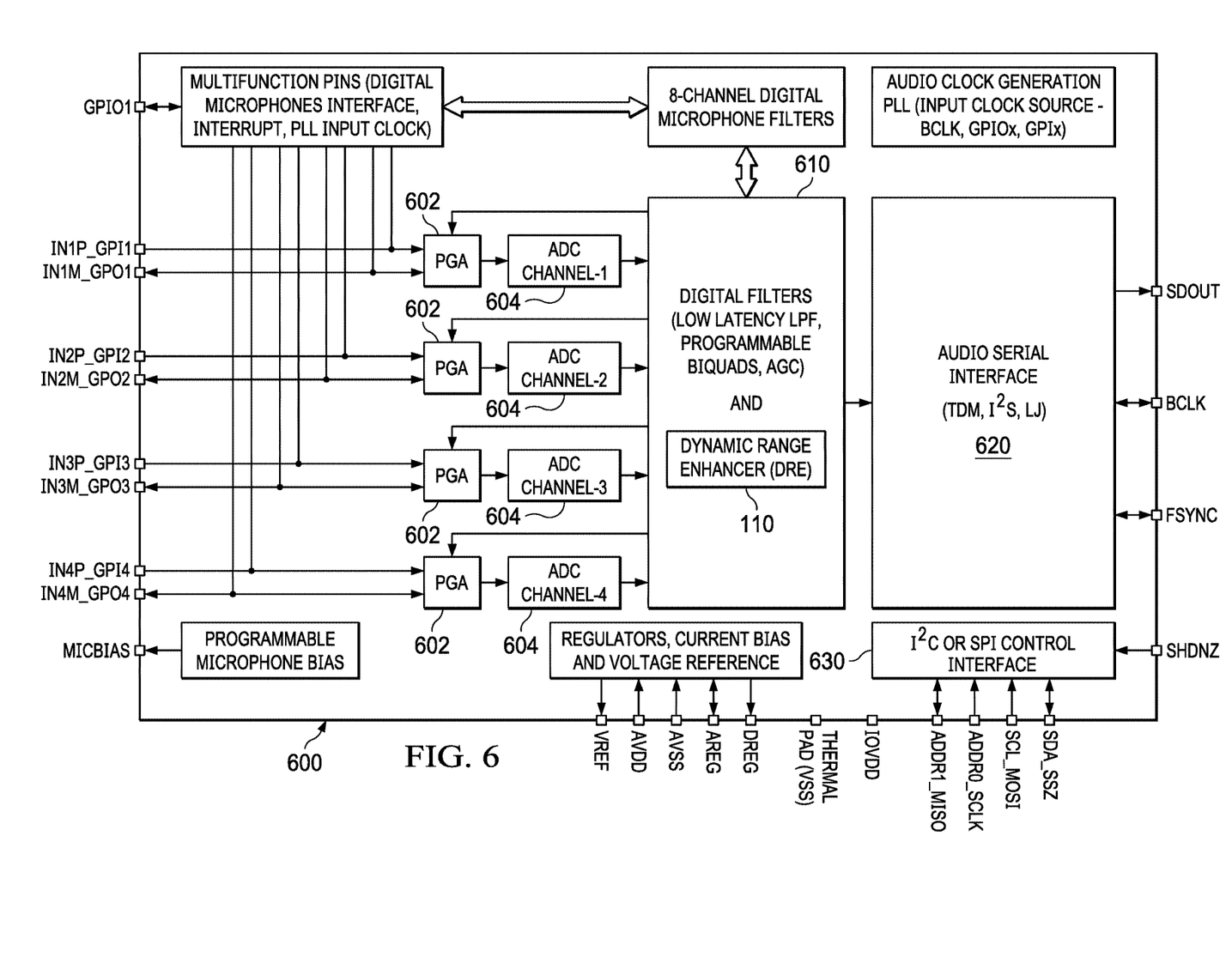
FIG. 6 shows another example of an implementation of the ADC of FIG. 1.

FIG. 6 shows an example implementation of an integrated circuit (IC) 600 containing four ADC channels-Channel 1 through Channel 4. Each ADC channel includes a PGA 602 coupled to a delta-sigma modulator ADC 604. The delta-sigma modulator ADCs 604 are coupled to a digital circuit 610, which includes the DRE circuit 110 described above as well as the digital filters, biquads, etc. A serial interface 620 is coupled to the digital circuit 610 through which the digital output codes can be provided to external logic. Control interface 630 is included over which the parameters Attack 150, Max Gain 151, Hold 152, and Threshold 154 can be programmed into the IC and stored in registers or other types of storage elements within the control interface 630 or elsewhere within the IC 600.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Modifications are possible in the described embodiments, and other embodiments are possible, within the scope of the claims.

What is claimed is:

1. A circuit, comprising:
   a programmable gain amplifier (PGA) having a PGA output;
   a delta-sigma modulator having an input coupled to the PGA output, the delta-sigma modulator having a delta-sigma modulator output;
   a digital filter coupled to the delta-sigma modulator output; and
   a dynamic range enhancer (DRE) circuit coupled to the delta-sigma modulator output and to the PGA, the DRE circuit is configured to:
      monitor a signal level of the delta-sigma modulator output; and
      responsive to the signal level being less than a DRE threshold, program the PGA for a gain level greater than unity gain and cause the digital filter to implement an attenuation of a same magnitude as the gain level to be programmed into the PGA.

2. The circuit of claim 1, wherein the DRE circuit is configured to compute the gain level for the PGA based on a comparison of an output signal derived from the delta-sigma modulator output and a threshold.

3. The circuit of claim 2, wherein the DRE circuit is configured to program a unity gain for the PGA responsive to the output signal derived from the delta-sigma modulator being greater than the DRE threshold.

4. The circuit of claim 1, wherein the DRE circuit includes an averager configured to smooth the gain level to be programmed into the PGA.

5. The circuit of claim 1, wherein the DRE circuit includes:
   a linear-to-log converter to convert a signal derived from the delta-sigma modulator output to a dB value;
   a gain computer to determine whether the dB value is above or below the DRE threshold and to generate a gain computer output value based in part on the comparison; and
   a level calculator to determine a difference between the gain computer output value and the dB value to produce a level calculator output value.

6. The circuit of claim 5, wherein the DRE circuit includes an averager to determine an average of the level calculator output value.

7. The circuit of claim 5, wherein the DRE circuit further includes a delay compensator that is configured to delay application of the attenuation to the digital filter relative to the PGA programmed for the gain level.

8. The circuit of claim 7, wherein the DRE circuit includes a processor and storage, the storage including machine instructions, which when executed by the processor, cause the processor to implement the gain computer, the level calculator, and the averager.

9. A circuit, comprising:
   a programmable gain amplifier (PGA) having a PGA output;
   an analog-to-digital converter (ADC) having an input coupled to the PGA output, the ADC having an ADC output;
   a digital signal chain coupled to the ADC output; and
   a dynamic range enhancer (DRE) circuit configured to:
      monitor a signal level of, or derived from, the ADC output; and
      responsive to the signal level being less than a DRE threshold, program the PGA for a gain level greater than unity gain and cause the digital signal chain to implement an attenuation of a same magnitude as the gain level to be programmed into the PGA.

10. The circuit of claim 9, wherein the ADC comprises a delta-sigma modulator.

11. The circuit of claim 9, wherein the digital signal chain includes a digital filter, and the DRE circuit is configured to cause the digital filter to implement the attenuation.

12. The circuit of claim 9, wherein the DRE circuit is configured to compute the gain level for the PGA based on a comparison of, or derived from, an output signal of the ADC output and a threshold.

13. The circuit of claim 12, wherein the DRE circuit is configured to program a unity gain for the PGA responsive to the output signal being greater than the DRE threshold.

14. The circuit of claim 9, wherein the DRE circuit includes an averager configured to smooth the gain level to be programmed into the PGA.

15. The circuit of claim 9, wherein the DRE circuit includes:
a linear-to-log converter to convert a signal derived from the delta-sigma modulator output to a dB value;
a gain computer to determine whether the dB value is above or below the DRE threshold and to generate a gain computer output value based in part on the comparison; and
a level calculator to determine a difference between the gain computer output value and the dB value to produce a level calculator output value.

16. The circuit of claim 15, wherein the DRE circuit includes an averager to determine an average of the level calculator output value.

17. The circuit of claim 15, wherein the DRE circuit further includes a delay compensator that is configured to delay application of the attenuation to the digital filter relative to the PGA programmed for the gain level.

18. A circuit, comprising:
a programmable gain amplifier (PGA) having a PGA output;
a delta-sigma modulator having an input coupled to the PGA output, the delta-sigma modulator having a delta-sigma modulator output;
a digital filter coupled to the delta-sigma modulator output; and
a dynamic range enhancer (DRE) circuit coupled to the delta-sigma modulator output and to the PGA, the DRE circuit is configured to:
monitor a signal level of the delta-sigma modulator output; and
responsive to the signal level being less than a DRE threshold, program the PGA for a gain level greater than unity gain and cause the digital filter to implement an attenuation of a same magnitude as the gain level to be programmed into the PGA, wherein the DRE circuit is configured to program the gain level for the PGA based on a comparison of an output signal derived from the delta-sigma modulator output and a threshold.

19. The circuit of claim 18, wherein the DRE circuit includes:
a linear-to-log converter to convert a signal derived from the delta-sigma modulator output to a dB value;
a gain computer to determine whether the dB value is above or below the DRE threshold and to generate a gain computer output value based in part on the comparison;
a level calculator to determine a difference between the gain computer output value and the dB value to produce a level calculator output value; and
an averager to determine an average of the level calculator output value.

20. The circuit of claim 19, wherein the programmable PGA has an PGA input configured to receive an electrical signal from an audio source.

* * * * *